(12) United States Patent
Berg

(10) Patent No.: US 7,417,839 B2
(45) Date of Patent: Aug. 26, 2008

(54) ZENER-ZAP MEMORY

(75) Inventor: Bengt Berg, Solna (SE)

(73) Assignee: Infineon Technologies AG (DE)

( * ) Notice: Subject to any disclaimer, the term of this patent is extended or adjusted under 35 U.S.C. 154(b) by 315 days.

(21) Appl. No.: 11/380,320

(22) Filed: Apr. 26, 2006

(65) Prior Publication Data

US 2006/0256490 A1    Nov. 16, 2006

Related U.S. Application Data

(63) Continuation of application No. PCT/SE2004/001557, filed on Oct. 27, 2004.

(30) Foreign Application Priority Data

Oct. 30, 2003    (SE) .................................. 0302862

(51) Int. Cl.
    *H02H 9/00*    (2006.01)
(52) U.S. Cl. .................................. 361/91.6
(58) Field of Classification Search .............. 361/91.6
    See application file for complete search history.

(56) References Cited

U.S. PATENT DOCUMENTS

| 5,446,407 | A |  | 8/1995 | Yamamoto ................. 327/525 |
|---|---|---|---|---|
| 5,572,472 | A | * | 11/1996 | Kearney et al. ............. 365/201 |
| 5,619,122 | A | * | 4/1997 | Kearney et al. ............. 323/312 |
| 5,796,298 | A | * | 8/1998 | Kearney et al. ............. 327/561 |
| 5,856,742 | A | * | 1/1999 | Vulih et al. ................. 323/315 |
| 7,145,255 | B2 | * | 12/2006 | Lutz et al. .................. 257/529 |

FOREIGN PATENT DOCUMENTS

| EP | 0 595 629 A1 | 10/1993 |
|---|---|---|
| JP | 2003-068858 | 3/2003 |

OTHER PUBLICATIONS

International Search Report; PCT/SE2004/001557; 1 Pg., Feb. 18, 2005.

* cited by examiner

*Primary Examiner*—Stephen W Jackson
(74) *Attorney, Agent, or Firm*—Coats & Bennett, P.L.L.C.

(57) ABSTRACT

In an integrated circuit for electrically permanently program information in the integrated circuit a current is driven through an NPN-transistor. The integrated circuit has a first current feeding circuit having an output connected via a resistor to the NPN-transistor, a feeding point connectable to a feeding voltage, and a control input for controlling the programming of the NPN-transistor. The integrated circuit also has at least a second current feeding circuit having an output connected to the feeding point for the first current feeding circuit, a feeding point connectable to a feeding voltage, and a control input for controlling the programming of the NPN-transistor. Finally the integrated circuit has a first voltage level controller provided to split the voltage needed to program the NPN-transistor over the first and at least second current feeding circuit.

18 Claims, 3 Drawing Sheets

ZENER-ZAP MEMORY

CROSS-REFERENCE TO RELATED APPLICATIONS

This application is a continuation of co-pending International Application No. PCT/SE2004/001557 filed Oct. 27, 2004, which designates the United States, and claims priority to Swedish application number SE0302862-8 filed Oct. 30, 2003.

TECHNICAL FIELD

The present invention relates to an integrated circuit for permanently electrically programming information in said integrated circuit. More specifically the present invention relates to an integrated bi-polar circuit for permanently programming information in said integrated circuit when said integrated circuit comprises components incapable of sustaining the voltage necessary for electrically programming said information.

BACKGROUND

One way to permanently and electrically program bi-polar integrated circuits is to use so-called Zener-zap of NPN-transistors. The NPN-transistor can be programmed by forcing such a strong current through the transistor so that aluminium from the interconnect pattern migrates into the silicon and forms a short-circuit between the base and the emitter.

The NPN-transistor can be used as a logical one or a logical zero when it is zapped, depending on the connected logic. Thus, a sequence of initially non-zapped NPN-transistors can be used to represent a sequence of binary numbers, representing a digital number. This sequence may then be altered, by zapping selected binary numbers in the sequence, to change the digital number represented by said sequence of NPN-transistors.

As an example, the operating point for a power transistor may initially be set to a predetermined value in an integrated circuit. After testing and tuning it is possible that the operating point should be changed slightly to achieve better performance. If the predetermined value for the operating point is set in the integrated circuit using NPN-transistors this value may be changed later, after tuning, by zapping carefully selected NPN-transistors.

It is possible to connect the NPN-transistor in two different ways to produce a Zener diode, namely with the collector connected either to the base or to the emitter. The collector-base connection requires less voltage to zap the Zener diode but the consumed current is considerably larger. If used as a memory function the collector-emitter connection is preferable since less current is consumed. If larger memories should be programmed the current requirements could otherwise be excessive. This alternative has, however, the draw-back that a larger voltage is required.

For circuits involving many components small dimensions are required. These components, having small dimensions, are less tolerant to high voltages. That is, they cannot sustain high voltage without being damaged. It would be preferable to be able to program many NPN-transistors simultaneously also in circuits involving many, and thus small, components, which are incapable of sustaining high voltages.

SUMMARY

It is a main object of the present invention to provide such an apparatus and a method that at least alleviates the above problems.

It is in this respect a particular object of the invention to provide such an arrangement that enables programming of an NPN-transistor in circuits comprising components with low voltage tolerances, without the penalty of excess current consumption.

These objects among others are, according to a first aspect of the present invention, attained by an integrated circuit for electrically permanently program information in said integrated circuit by driving a current through a Zener diode. The integrated circuit comprises a first current feeding circuit having an output, a feeding point connectable to a supply voltage, and a control input for controlling the programming of said Zener diode.

The integrated circuit also comprises at least a second current feeding circuit having an output connected via a resistor to said Zener diode, a feeding point connected to said output of said first current feeding circuit, and a control input for controlling the programming of said Zener diode.

Finally the integrated circuit comprises a first voltage level controller provided to split the voltage needed to program said Zener diode over said first and at least a second current feeding circuit.

By this arrangement a process for manufacturing integrated circuits can be used also for producing circuits with the capability to permanently electrically program information using zapping of a Zener-connected NPN-transistor, when the circuit comprises components which are unable to sustain the voltage levels needed for said zapping. Thereby smaller components can be used in said circuit, which in turn means that many more components may be fitted in one integrated circuit allowing more complex circuits to be produced, which includes programming of information using Zener-zapping of Zener connected NPN-transistors.

According to a preferred embodiment the first voltage level controller is connected between the output of said at least second current feeding circuit and the control input of said first current feeding circuit.

According to another preferred embodiment a second voltage level controller is provided to control the voltage over said resistor to thereby set the current through said resistor and said Zener diode.

According to another preferred embodiment the second voltage level controller is connected between said Zener diode and said control input to said second current feeding circuit.

According to another preferred embodiment the first voltage level controller is provided to prevent the voltage level over each of said first and at least second current feeding circuits to reach unsustainable levels.

According to another preferred embodiment the first voltage level controller is a second Zener diode.

According to another preferred embodiment each of said current feeding circuits comprises: a first and second transistor having collectors connected to said feeding point, the base of said first transistor is connected to said control input and via a first resistor to the emitter of said first transistor, the base of said second transistor is connected to the emitter of said first transistor and via a second resistor to the emitter of said second transistor, and said emitter of said second transistor is connected to said output of said current feeding circuit.

According to another preferred embodiment the Zener diode is an NPN-transistor having the collector connected to the emitter.

Alternatively, the NPN-transistor may have the collector unconnected. In this case it would be more correct to call the NPN-transistor a diode rather than a transistor.

According to another preferred embodiment the integrated circuit comprises components that are unable to sustain the voltage levels required for zapping said Zener diode.

Further characteristics of the invention and advantages thereof will be evident from the following detailed description of embodiments of the invention.

BRIEF DESCRIPTION OF THE DRAWINGS

The present invention will become more fully understood from the detailed description of embodiments of the present invention given herein below and the accompanying FIGS. 1 to 3, which are given by way of illustration only, and thus are not limitative of the present invention.

DETAILED DESCRIPTION

In the following description, for purposes of explanation and not limitation, specific details are set forth, such as particular techniques and applications in order to provide a thorough understanding of the present invention. However, it will be apparent to one skilled in the art that the present invention may be practiced in other embodiments that depart from these specific details. In other instances, detailed descriptions of well-known methods and apparatuses are omitted so as not to obscure the description of the present invention with unnecessary details.

Figure 1:
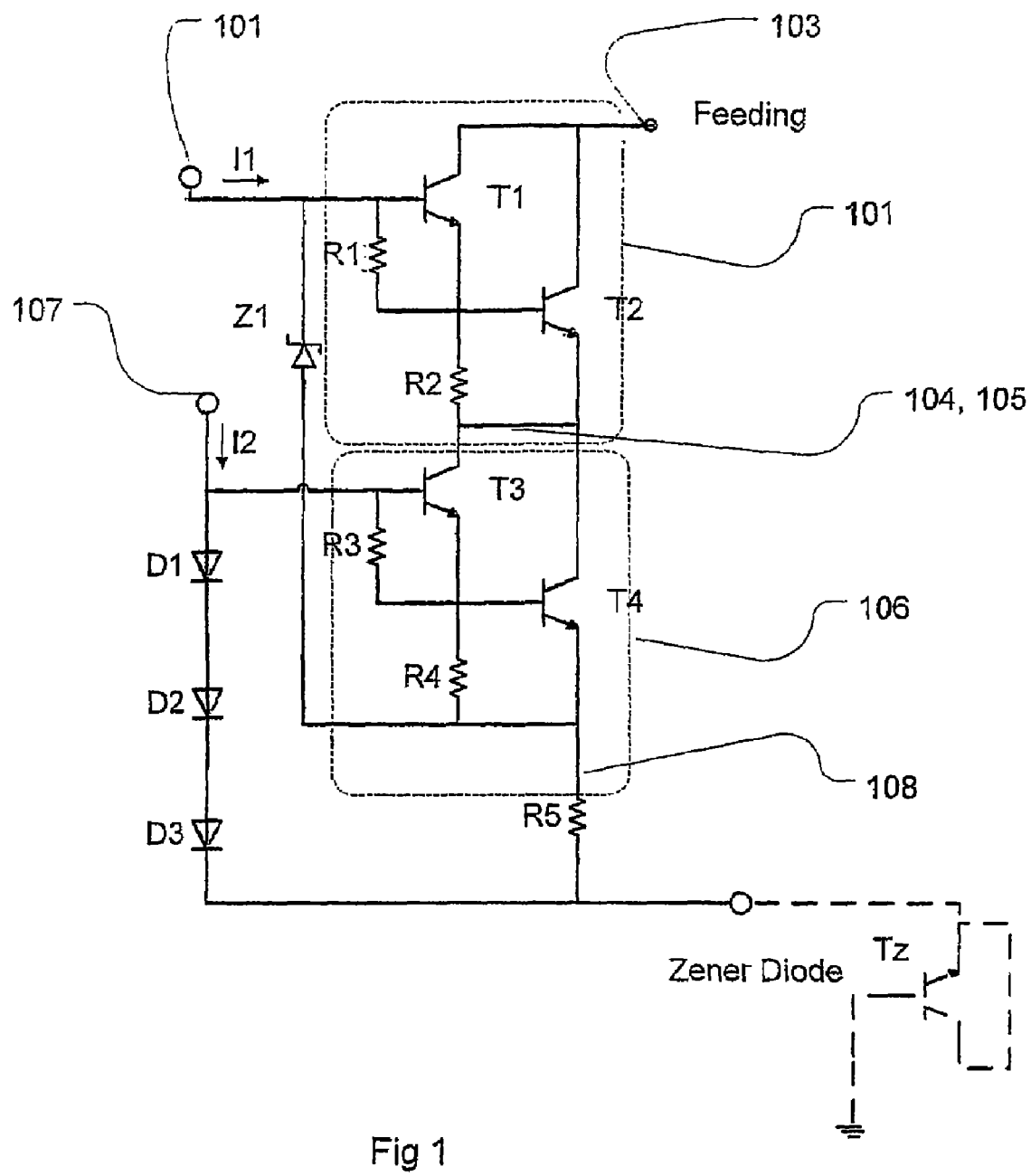
FIG. 1 is a schematic circuit diagram of a preferred embodiment according to the invention.

FIG. 1 is a schematic circuit diagram of a preferred embodiment according to the invention. A first current generator 101 comprises a control input 102, a feeding input 103 and an output 104. The output 104 of the first current generator 101 is connected to a feeding input 105 of a second current generator 106 also comprising a control input 107 and an output 108. The first and second current generators are structurally similar comprising two transistors and two resistors.

The first current generator comprises a first transistor T1 having a collector connected to said feeding input 103 and a base connected to said control input 102. The emitter of said first transistor T1 is connected to the base of a second transistor T2, and the base of said first transistor T1 is connected to the emitter of said first transistor T1 via a first resistor R1. Similarly, the base of said second transistor T2 is connected to the emitter of said second transistor T2 via a second resistor R2, the collector of said second transistor T2 is connected to said feeding input 103 and the emitter of said second transistor is connected to said output 104.

As stated earlier, the second current generator 106 is similar to the first current generator 101 and thus comprises a third and a fourth transistor T3 and T4, respectively, having collectors connected to the feeding input 105 for said second current generator 106, which also is the output for said first current generator 101. The base of each of said third and fourth transistors T3 and T4, respectively, are connected to respective emitters via third and fourth resistors R3 and R4, respectively. Finally, the emitter of the third transistor T3 is connected to the base of the fourth transistor T4, and the emitter of said fourth transistor constitutes the output 108 from said second current generator. The base of the transistor T3 is connected to the control input 107.

The second current generator is connected to a fifth resistor R5, which in turn is connected to a NPN-transistor Tz, which is implementing the Zener diode to be zapped. Between the NPN-transistor Tz and the control input 107 for the second current generator are three diodes, D1, D2 and D3, respectively, connected. Furthermore, between the output 108 of the second current generator 106 and the control input 102 of the first current generator 101 is a second Zener diode Z1 connected.

The operation of the circuit is as follows. A first current I1 is fed to the control input 102 of the first current generator 101 and a second current I2 is fed to the control input 107 of the second current generator 106. If both of the first and second current is off, transistors T1 to T4 are not conducting and the circuit is thus turned off. If the currents I1 and I2 are on and if the feeding voltage is high enough, the transistors T1 to T4 are conducting, and the circuit starts operating. When the voltage over the NPN-transistor Tz, which is connected as a Zener diode, reaches the Zener breakdown level, around 6-7 volt, a current starts flowing through the circuit.

The fifth resistor R5 and the three diodes D1 to D3 limit the current through the circuit. The three diodes D1 to D3 are provided to place the base of the transistor T3 three diode voltage drops above the lower side of the resistor R5, while the higher side of the resistor R5 is two diode voltage drops below the base of the transistor T3, namely the voltage drops over the base-emitter of transistors T3 and T4. Thus, one diode voltage drop is remaining over the resistor R5 and this voltage and the resistance of the resistor R5 determine the current. The current is suitable selected to be high enough to zap the transistor Tz.

Consequently, the current flowing through the NPN-transistor Tz is too large for the Zener voltage. The voltage over the NPN-transistor Tz increases rapidly at the same time as the voltage over the circuit decreases. At this time the breakthrough, in the NPN-transistor Tz takes place. The NPN-transistor is thus short-circuited, the voltage over the former NPN-transistor Tz approaches zero volt and all voltage is put over the described circuit. The current is kept at the same value by the transistor R5 so that the total consumed current is not excessive, even if many transistors are zapped at the same time.

The Zener diode Z1 is provided so that the voltage over the second current generator 106, that is, the transistors T3 and T4, respectively, is not to high. The diode Z1 is connected between the emitter of the transistor T4 and the base of T1. The collector of T4 is two base-emitter voltage drops below the base of T1. Thus, the maximum voltage over T4 will be the voltage over the diode Z1 minus two diode voltage drops, namely T1 and T2. The maximum voltage over T3 will be the voltage over the diode Z1 minus three diode voltage drops, namely T1, T2 and T4. By suitably selecting the diode Z1, that is the voltage drop over Z1, a maximum, sustainable voltage level can be secured over the second current generator 106, that is T4 and T3. When this voltage level is reached, the voltage will instead continue to increase over the first current generator 101, that is, T1 and T2, since the current I1 partly will flow through Z1.

Figure 2:
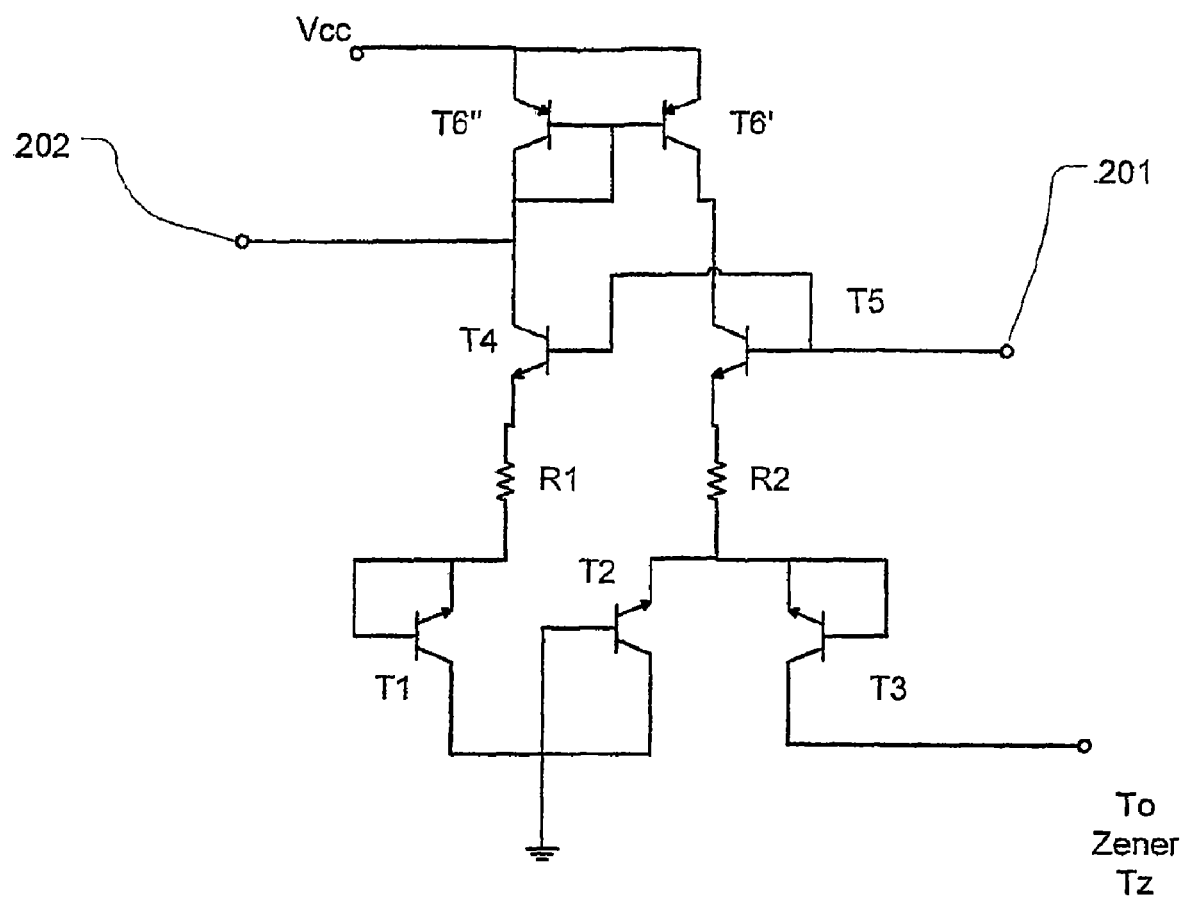
FIG. 2 is a schematic circuit diagram of an arrangement for determining if a Zener diode has been zapped.

FIG. 2 is a schematic circuit diagram of an arrangement for sensing if an NPN-transistor has been zapped or not. A first and a second transistor T1 and T2 has respective collectors connected to ground. The base of Ti is connected to the collector of T1, which also is connected to a resistor R1. The base of T2 is connected to the collector of T2 and the emitter of T2 is connected to a second resistor R2. The first resistor R1 has a resistance of approximately twice the resistance of the second resistor R2. A third transistor T3 has a collector connected to the NPN-transistor (not shown). The base of T3 is connected to the emitter of T3 and further to the emitter of T2.

The first resistor R1 is further connected to a fourth transistor T4, and the second resistor R2 is connected to a fifth transistor T5. The base of transistors T4 and T5 is connected to a control input 201 and the collectors are connected to a current mirror T6, comprising two transistors T6' and T6'', for drawing current. The collector of T4 is further connected to an output 202.

To operate the circuit the control input 201 is raised to approximately 2 volts. If the Zener-connected NPN-transistor (not shown) has been zapped the output will be high and if the transistor has not been zapped the output will be low.

Figure 3:
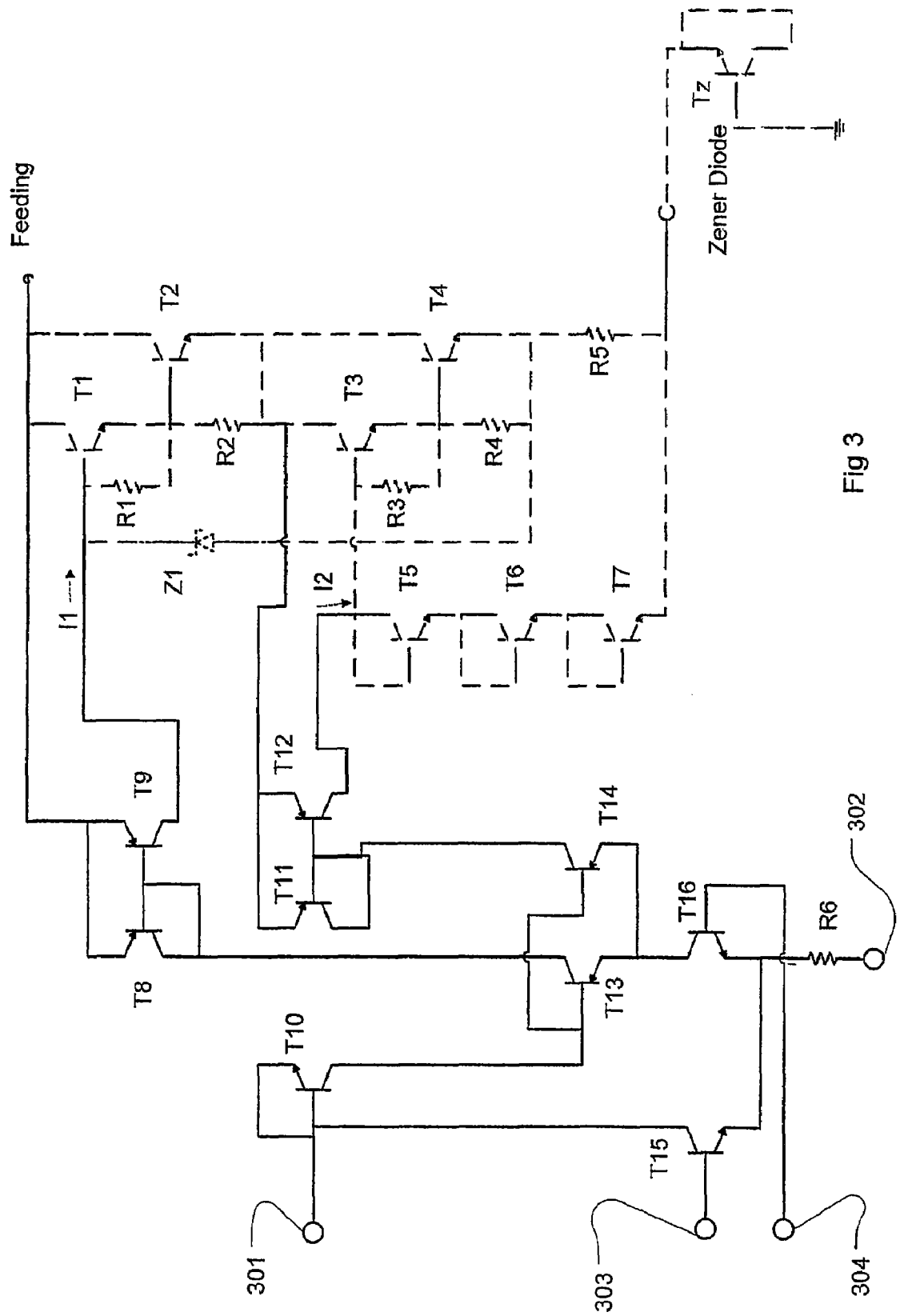
FIG. 3 is a schematic circuit diagram of an arrangement for providing control currents to the circuit in FIG. 1.

FIG. 3 is a schematic circuit diagram of an arrangement for providing the control currents in the circuit in FIG. 1. The circuits to the right side in FIG. 3 are the circuits described in connection with FIG. 1 and will not be further dealt with here.

Transistors T8 and T9 provide a current mirror as the transistors T11 and T12 also do, for providing the control currents I1 and I2. The transistors T10, T13 and T14 provide protection for the high voltage levels. A low feeding input 301 provides driving voltage to the circuit. The input 301 is a low voltage input, approximately 8 volt, compared to the feeding input 103, which is a high-level voltage input, approximately 30 to 40 volt. An input 302 supplies a current during zapping of the NPN-transistor. Two logic inputs, 303 and 304, provide control of the circuit. If the input 303 is high in relation to the input 304, the current from the input 302 will flow, through a transistor T15, to the low voltage input 301. If the opposite is true, that is, if the input 304 is high compared to the input 303 the current flows through a transistor T16 to the two current mirrors constituted by T8, T9 and T11, T12, respectively, and zapping of the NPN-transistor is performed.

It will be obvious that the invention may be varied in a plurality of ways. Such variations are not to be regarded as a departure from the scope of the invention. All such modifications as would be obvious to one skilled in the art are intended to be included within the scope of the appended claims.

What is claimed is:

1. An integrated circuit for electrically permanently program information in said integrated circuit by driving a current through a Zener diode, comprising:
   a first current feeding circuit comprising an output, a feeding point connectable to a feeding voltage, and a control input for control of the programming of said Zener diode,
   at least a second current feeding circuit comprising an output connected via a resistor to said Zener diode, a feeding point connected to said output of said first current feeding circuit, and a control input for control of the programming of said Zener diode, and
   a first voltage level controller provided to split the voltage needed to program said Zener diode over said first and at least second current feeding circuit.

2. An integrated circuit according to claim 1, wherein said first voltage level controller is connected between the output of said at least second current feeding circuit and the control input of said first current feeding circuit.

3. An integrated circuit according to claim 1, wherein a second voltage level controller is provided to control the voltage over said resistor to thereby set the current through said resistor and said Zener diode.

4. An integrated circuit according to claim 3, wherein said second voltage level controller is connected between said Zener diode and said control input of said second current feeding circuit.

5. An integrated circuit according to claim 2, wherein said first voltage level controller is provided to prevent the voltage level over each of said first and at least second current feeding circuits to reach unsustainable levels.

6. An integrated circuit according to claim 1, wherein said first voltage level controller is a second Zener diode.

7. An integrated circuit according to claim 1, wherein each of said current feeding circuits comprises:
   a first and second transistor having collectors connected to said feeding point,
   the base of said first transistor is connected to said control input and via a first resistor to the emitter of said first transistor,
   the base of said second transistor is connected to the emitter of said first transistor and via a second resistor to the emitter of said second transistor, and
   said emitter of said second transistor is connected to said output of said current feeding circuit.

8. An integrated circuit according to claim 1, wherein said Zener diode is an NPN-transistor with the collector connected to the emitter.

9. An integrated circuit according to claim 1, wherein the integrated circuit comprises components that are unable to sustain the voltage levels required for zapping said Zener diode.

10. An integrated circuit for electrically permanently program information in said integrated circuit by driving a current through a Zener diode, comprising:
    a first current feeding circuit comprising an output, a feeding point connectable to a feeding voltage, and a control input for control of the programming of said Zener diode,
    at least a second current feeding circuit comprising an output connected via a resistor to said Zener diode, a feeding point connected to said output of said first current feeding circuit, and a control input for control of the programming of said Zener diode,
    a first voltage level controller provided to split the voltage needed to program said Zener diode over said first and at least second current feeding circuit, and
    a second voltage level controller to control the voltage over said resistor to thereby set the current through said resistor and said Zener diode, wherein said second voltage level controller is connected between said Zener diode and said control input of said second current feeding circuit.

11. An integrated circuit according to claim 10, wherein said first voltage level controller is provided to prevent the voltage level over each of said first and at least second current feeding circuits to reach unsustainable levels.

12. An integrated circuit according to claim 10, wherein said first voltage level controller is a second Zener diode.

13. An integrated circuit according to claim 10, wherein each of said current feeding circuits comprises:
    a first and second transistor having collectors connected to said feeding point,
    the base of said first transistor is connected to said control input and via a first resistor to the emitter of said first transistor,
    the base of said second transistor is connected to the emitter of said first transistor and via a second resistor to the emitter of said second transistor, and said emitter of said second transistor is connected to said output of said current feeding circuit.

14. An integrated circuit according to claim 10, wherein said Zener diode is an NPN-transistor with the collector connected to the emitter.

15. An integrated circuit according to claim 10, wherein the integrated circuit comprises components that are unable to sustain the voltage levels required for zapping said Zener diode.

16. An integrated circuit for electrically permanently program information in said integrated circuit by driving a current through a Zener diode, comprising:
- a first current feeding circuit comprising an output, a feeding point connectable to a feeding voltage, and a control input for control of the programming of said Zener diode,
- at least a second current feeding circuit comprising an output connected via a resistor to said Zener diode, a feeding point connected to said output of said first current feeding circuit, and a control input for control of the programming of said Zener diode, and
- a first voltage level controller provided to split the voltage needed to program said Zener diode over said first and at least second current feeding circuit, wherein each of said current feeding circuits comprises:
- a first and second transistor having collectors connected to said feeding point,
- the base of said first transistor is connected to said control input and via a first resistor to the emitter of said first transistor,
- the base of said second transistor is connected to the emitter of said first transistor and via a second resistor to the emitter of said second transistor, and
- said emitter of said second transistor is connected to said output of said current feeding circuit.

17. An integrated circuit according to claim 16, wherein said Zener diode is an NPN-transistor with the collector connected to the emitter.

18. An integrated circuit according to claim 16, wherein the integrated circuit comprises components that are unable to sustain the voltage levels required for zapping said Zener diode.

* * * * *